United States Patent
Sadjadi

(10) Patent No.: US 7,271,108 B2
(45) Date of Patent: Sep. 18, 2007

(54) MULTIPLE MASK PROCESS WITH ETCH MASK STACK

(75) Inventor: S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/170,273

(22) Filed: Jun. 28, 2005

(65) Prior Publication Data

US 2006/0290012 A1    Dec. 28, 2006

(51) Int. Cl.
*H01L 21/311*    (2006.01)

(52) U.S. Cl. ............... 438/717; 438/702; 257/E21.548

(58) Field of Classification Search ............... 438/700, 438/702, 717; 257/E21.548
See application file for complete search history.

(56) References Cited

U.S. PATENT DOCUMENTS

| | | | | |
|---|---|---|---|---|
| 4,707,218 A | * | 11/1987 | Giammarco et al. | 438/421 |
| 4,801,350 A | * | 1/1989 | Mattox et al. | 438/702 |
| 4,838,991 A | * | 6/1989 | Cote et al. | 216/46 |
| 4,857,477 A | * | 8/1989 | Kanamori | 438/386 |
| 5,459,099 A | | 10/1995 | Hsu | |
| 5,654,238 A | * | 8/1997 | Cronin et al. | 438/700 |
| 5,874,359 A | * | 2/1999 | Liaw et al. | 438/640 |
| 5,895,740 A | * | 4/1999 | Chien et al. | 430/313 |
| 5,981,148 A | | 11/1999 | Brown et al. | |
| 6,183,937 B1 | | 2/2001 | Tsai et al. | |
| 6,416,933 B1 | | 7/2002 | Singh et al. | |
| 6,528,372 B2 | * | 3/2003 | Lukanc et al. | 438/286 |
| 6,589,713 B1 | * | 7/2003 | Okoroanyanwu | 430/313 |
| 6,610,607 B1 | | 8/2003 | Armbrust et al. | |
| 6,665,856 B1 | | 12/2003 | Pierrat et al. | |
| 6,955,961 B1 | | 10/2005 | Chung | |

(Continued)

FOREIGN PATENT DOCUMENTS

DE    10223249    12/2003

(Continued)

OTHER PUBLICATIONS

U.S. Appl. No. 11/050,985, entitled "Reduction of Feature Critical Dimensions Using Multiple Masks", by inventors Marks et al., filed Feb. 3, 2005.

(Continued)

*Primary Examiner*—Michelle Estrada
*Assistant Examiner*—Jarrett J Stark
(74) *Attorney, Agent, or Firm*—Beyer Weaver LLP

(57) ABSTRACT

A method for forming etch features in an etch layer over a substrate is provided. An etch mask stack is formed over the etch layer. A first mask is formed over the etch mask stack. A sidewall layer is formed over the first mask, which reduces the widths of the spaces defined by the first mask. A first set of features is etched into the etch mask stack through the sidewall layer. The mask and sidewall layer are removed. An additional feature step is performed, comprising forming an additional mask over the etch mask stack, forming a sidewall layer over the additional mask, etching a second set of features at least partially into the etch mask stack. A plurality of features is etched into the etch layer through the first set of features and the second set of features in the etch mask stack.

21 Claims, 15 Drawing Sheets

U.S. PATENT DOCUMENTS

| | | | |
|---|---|---|---|
| 7,033,948 B2 * | 4/2006 | Chung et al. | 438/706 |
| 2002/0071997 A1 | 6/2002 | Ahrens et al. | |
| 2002/0182549 A1 | 12/2002 | Chang et al. | |
| 2003/0073298 A1 | 4/2003 | Gonzalez et al. | |
| 2003/0232509 A1 | 12/2003 | Chung et al. | |
| 2004/0048170 A1 | 3/2004 | Pierrat et al. | |
| 2004/0180267 A1 | 9/2004 | Tejnil | |
| 2004/0229135 A1 | 11/2004 | Wang et al. | |
| 2005/0048785 A1 | 3/2005 | Kang et al. | |
| 2005/0070111 A1 | 3/2005 | Kushibiki et al. | |
| 2005/0081178 A1 | 4/2005 | Sivakumar et al. | |
| 2006/0011575 A1 * | 1/2006 | Chung et al. | 216/41 |

FOREIGN PATENT DOCUMENTS

| | | |
|---|---|---|
| EP | 05088375 | 4/1993 |

OTHER PUBLICATIONS

U.S. Appl. No. 11/126,466, entitled "Reticle Alignment and Overlay for Multiple Reticle Process", by inventors Sadjadi et al., filed May 10, 2005.

U.S. Appl. No. 11/126,708, entitled "Computer Readable Mask Shrink Control Processor", by inventors Sadjadi et al., filed May 10, 2005.

U.S. Appl. No. 11/050,985, entitled "Reduction of Feature Critical Dimensions Using Multiple Masks", by inventors Marks et al., filed Feb. 3, 2005.

International Search Report and Written Opinion, mailed Jun. 23, 2006.

Office Action dated May 2, 2006, U.S. Appl. No. 11/050,985.

* cited by examiner

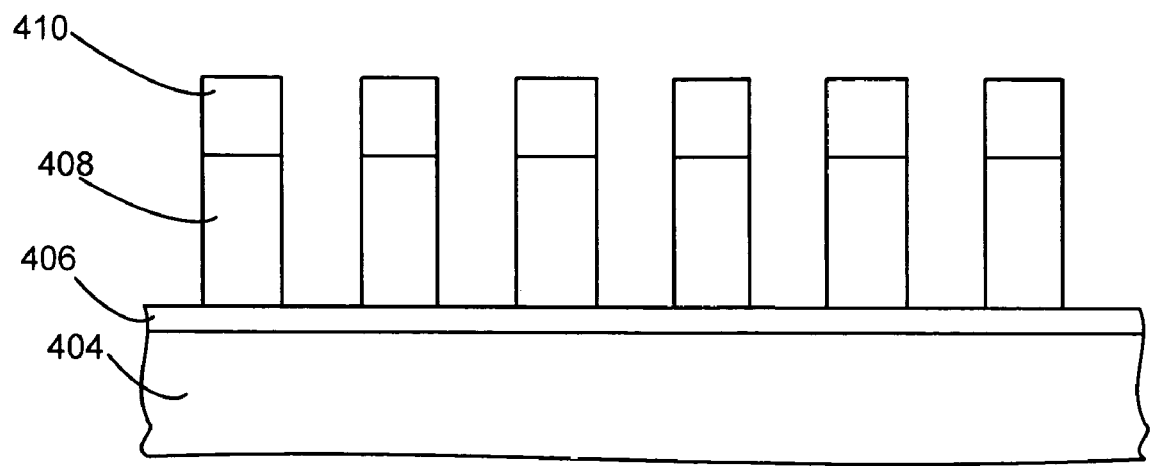
FIG. 4 I
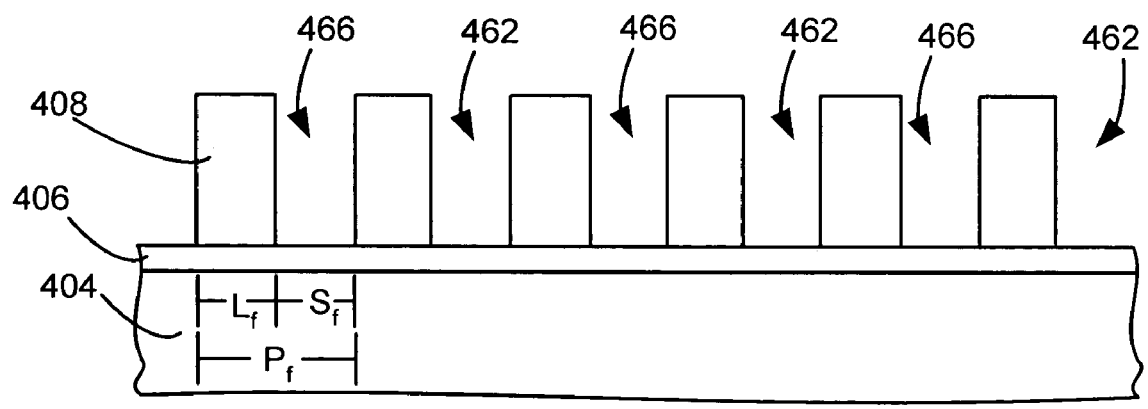
FIG. 4 J
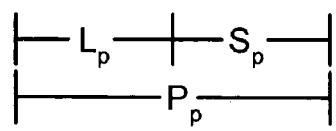

MULTIPLE MASK PROCESS WITH ETCH MASK STACK

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. Deep ultra violet (DUV) photoresist is exposed by 248 nm light. To facilitate understanding, FIG. 1A is a schematic cross-sectional view of a layer 108 over a substrate 104, with a patterned photoresist layer 112, over an ARL (Anti-reflective layer) 110 over the layer 108 to be etched forming a stack 100. The photoresist pattern has a critical dimension (CD), which may be the width 116 of the smallest feature. Due to optical properties dependent on wavelength, photoresist exposed by longer wavelength light has larger theoretical minimal critical dimensions.

A feature 120 may then be etched through the photoresist pattern, as shown in FIG. 1B. Ideally, the CD of the feature (the width of the feature) is equal to the CD 116 of the feature in the photoresist 112. In practice, the CD of the feature 116 may be larger than the CD of the photoresist 112 due to faceting, erosion of the photoresist, or undercutting. The feature may also be tapered, where the CD of the feature is at least as great as the CD of the photoresist, but where the feature tapers to have a smaller width near the feature bottom. Such tapering may provide unreliable features.

In order to provide features with smaller CD, features formed using shorter wavelength light are being pursued. 193 mn photoresist is exposed by 193 nm light. Using phase shift reticles and other technology, a 90-100 nm CD photoresist pattern may be formed, using 193 nm photoresist. This would be able to provide a feature with a CD of 90-100 nm. 157 nm photoresist is exposed by 157 nm light. Using phase shift reticles and other technology sub 90 nm CD photoresist patterns may be formed. This would be able to provide a feature with a sub 90 nm CD.

The use of shorter wavelength photoresists may provide additional problems over photoresists using longer wavelengths. To obtain CD's close to the theoretical limit the lithography apparatus should be more precise, which would require more expensive lithography equipment. Presently 193 nm photoresist and 157 nm photoresist may not have selectivities as high as longer wavelength photoresists and may deform more easily under plasma etch conditions.

In the etching of conductive layers, such as in the formation of memory devices, it is desirable to increase device density without diminishing performance.

FIG. 2A is a cross-sectional view of a patterned photoresist layer for producing conductive lines, when spacing between the lines is too close according to the prior art. Over a substrate 204, such as a wafer a barrier layer 206 may be placed. Over the barrier layer 206 a dielectric layer 208 such as a metal layer or a polysilicon layer is formed. Over the dielectric layer 208 an antireflective layer (ARL) 210 such as a DARC layer is formed. A patterned photoresist layer 212a is formed over the ARL 210. In this example the patterned photoresist lines 214a have a width defined as the line width "L", as shown. The spaces 222 have a width "S", as shown. The pitch length "P" is defined as the sum of the line width and the space width P=L+S, as shown. It is desirable to reduce the pitch length.

One way of reducing pitch with is by reducing space width. FIG. 2B is a cross-sectional view of a patterned photoresist layer for producing conductive or dielectric trench lines, when spacing between the lines is too close according to the prior art. Over a substrate 204, such as a wafer a barrier layer 206 may be placed. Over the barrier layer 206 a conductive or dielectric layer 208 such as a metal layer, a polysilicon layer, or a dielectric layer is formed. Over the layer 208 an antireflective layer (ARL) 210 such as a DARC layer is formed. A patterned photoresist layer 212 is formed over the ARL 210. In this example, the patterned photoresist layer 212b forms patterned lines 214b with photoresist residue 218 formed in spaces between the patterned lines 214b. The presence of the photoresist residue 218 is caused by providing too small of a space between the patterned lines 214b, since it is more difficult to remove residue from a small space. This may limit the density of the conductive lines that may be provided.

SUMMARY OF THE INVENTION

To achieve the foregoing and in accordance with the purpose of the present invention a method for forming etch features in an etch layer over a substrate is provided. An etch mask stack formed by at least one layer is formed over the etch layer. A first mask is formed over the etch mask stack wherein the first mask defines a plurality of spaces with widths. A sidewall layer is formed over the first mask wherein the sidewall layer reduces the widths of the spaces defined by the first mask. A first set of features is etched at least partially into the etch mask stack through the sidewall layer, wherein the features of the first set of features have widths that are smaller than the widths of the spaces defined by the first mask. The mask and sidewall layer are removed. An additional feature step is performed, comprising forming an additional mask over the etch mask stack, wherein the additional mask defines a plurality of spaces with widths, forming a sidewall layer over the additional mask, wherein the sidewall layer reduces the widths of the spaces defined by the additional mask, etching a second set of features at least partially into the etch mask stack through the sidewall layer, wherein the features have widths that are smaller than the widths of the spaces defined by the additional mask, and removing the mask and sidewall layer. A plurality of features is etched into the etch layer through the first set of features and the second set of features in the etch mask stack.

In another manifestation of the invention a method for forming features in an etch layer is provided. An etch mask stack formed by at least one layer is formed over the, etch layer. A first mask is formed over the etch mask stack wherein the first mask defines a plurality of spaces with widths and wherein the plurality of spaces have a critical dimension and a pitch. A sidewall layer is formed over the first mask wherein the sidewall layer reduces the widths of the spaces defined by the first mask. A first set of features is etched partially into the etch mask stack through the sidewall layer with a first etch chemistry, wherein the features have widths and a critical dimension, wherein the feature widths are at least 50% less than the widths of the spaces in the first mask and the critical dimension of the features is at least 50% less than the critical dimension of the spaces in the first mask and wherein the etch layer is not etched. The mask and sidewall layer are removed. An additional feature step is performed comprising forming an additional mask over the etch mask stack wherein the additional mask defines a plurality of spaces with widths and wherein the plurality of spaces have a critical dimension and a pitch, forming a sidewall layer over the additional mask, wherein the sidewall layer reduces the widths of the spaces defined by the additional mask, etching additional features partially into the etch stack mask through the sidewall layer, wherein the additional features have widths and a critical dimension, wherein the widths of the additional features are at least 50% less than the widths of the spaces in the additional mask and the critical dimension of the additional features is at least 50% less than the critical dimension of the spaces in the additional mask and wherein the features and additional features have a pitch which is at least 50% less than the pitch of the spaces in the first mask and the pitch of the spaces in the additional mask and wherein the etch layer is not etched, and removing the mask and sidewall layer. A plurality of features is etched into the etch layer through the first set of features and additional features of the etch mask stack using a second etch chemistry different from the first etch chemistry.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In order to provide features with small critical dimensions (CD) using an older technology photoresist process, a next generation photoresist mask process has been developed that uses a multiple masking and etching process.

Figure 1A:
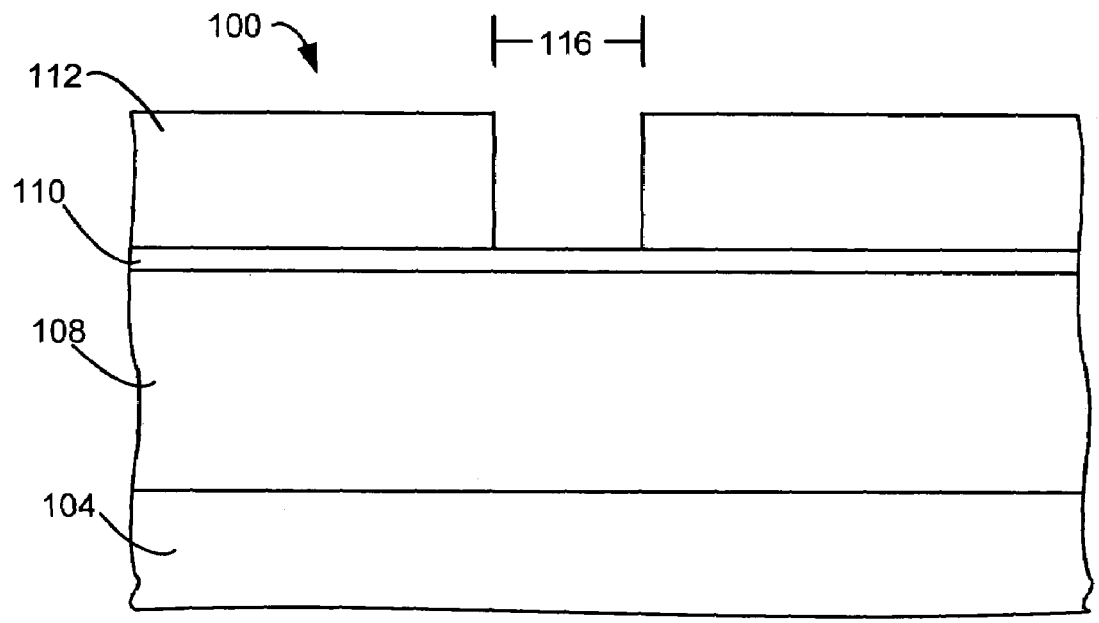
FIGS. 1A-B are schematic cross-sectional views of a stack etched according to the prior art.
Figure 1B:
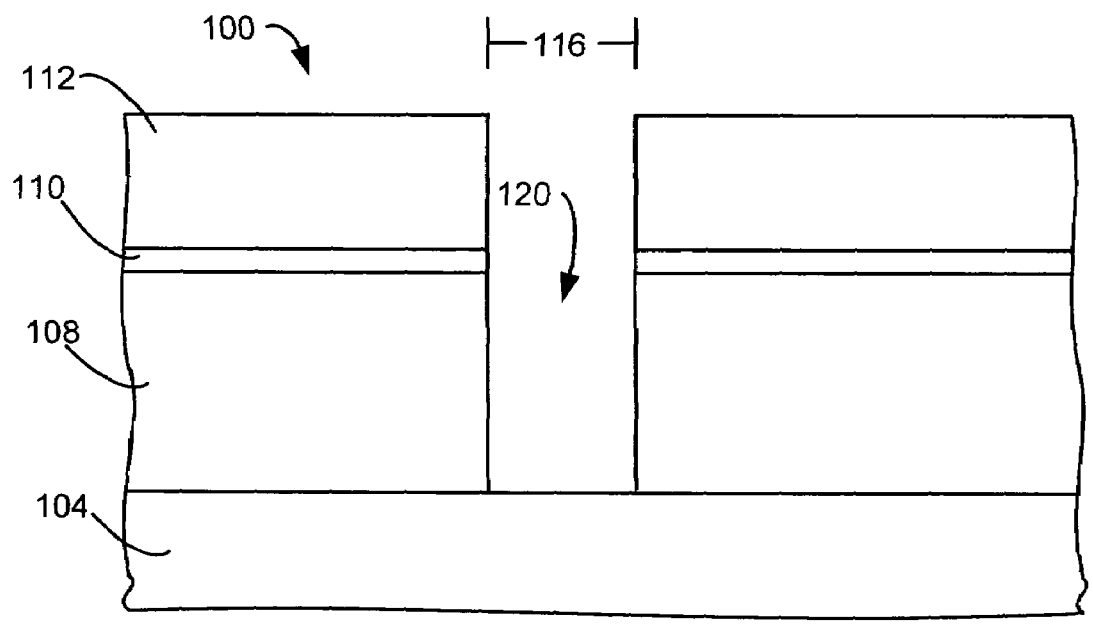
Figure 2:
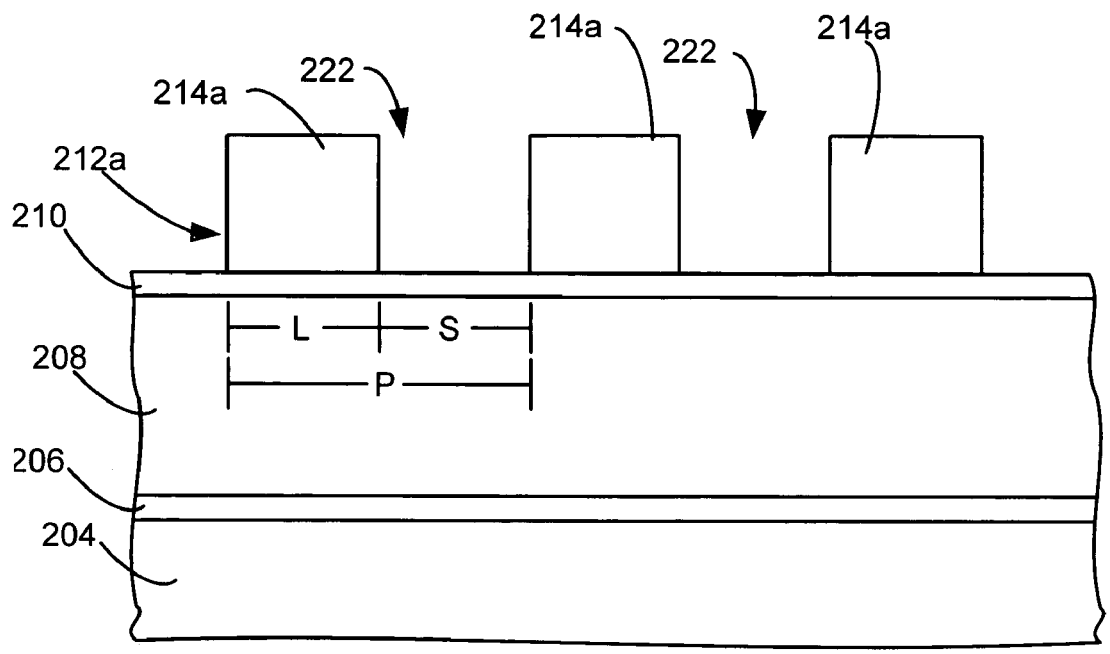
FIGS. 2A-B are schematic cross-sectional views of patterned photoresist layers formed according to the prior art.
Figure 2:
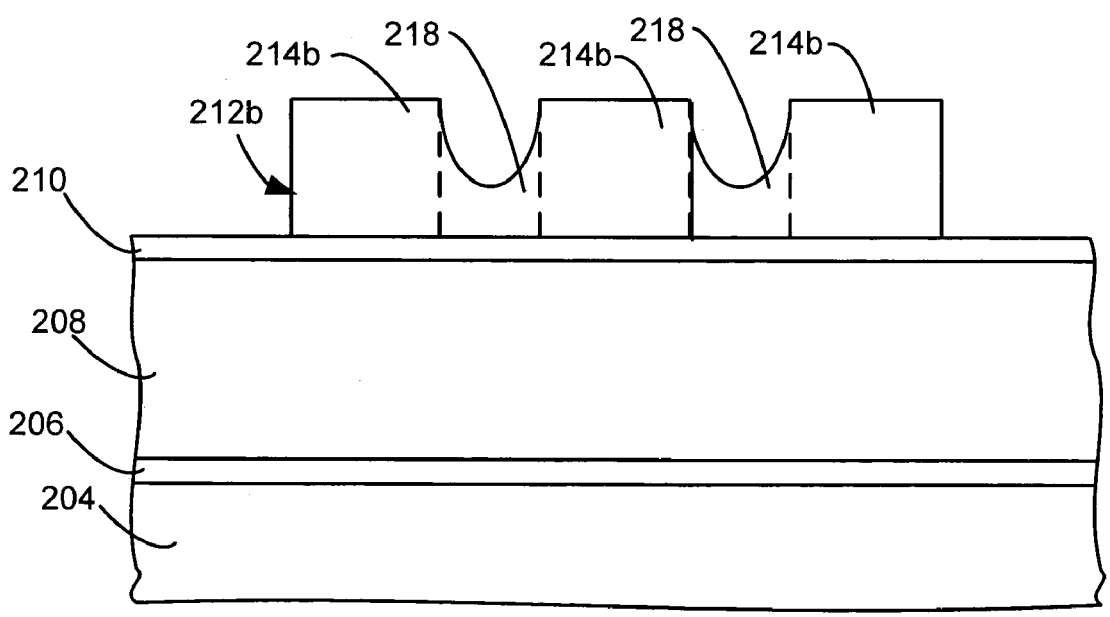
Figure 3:
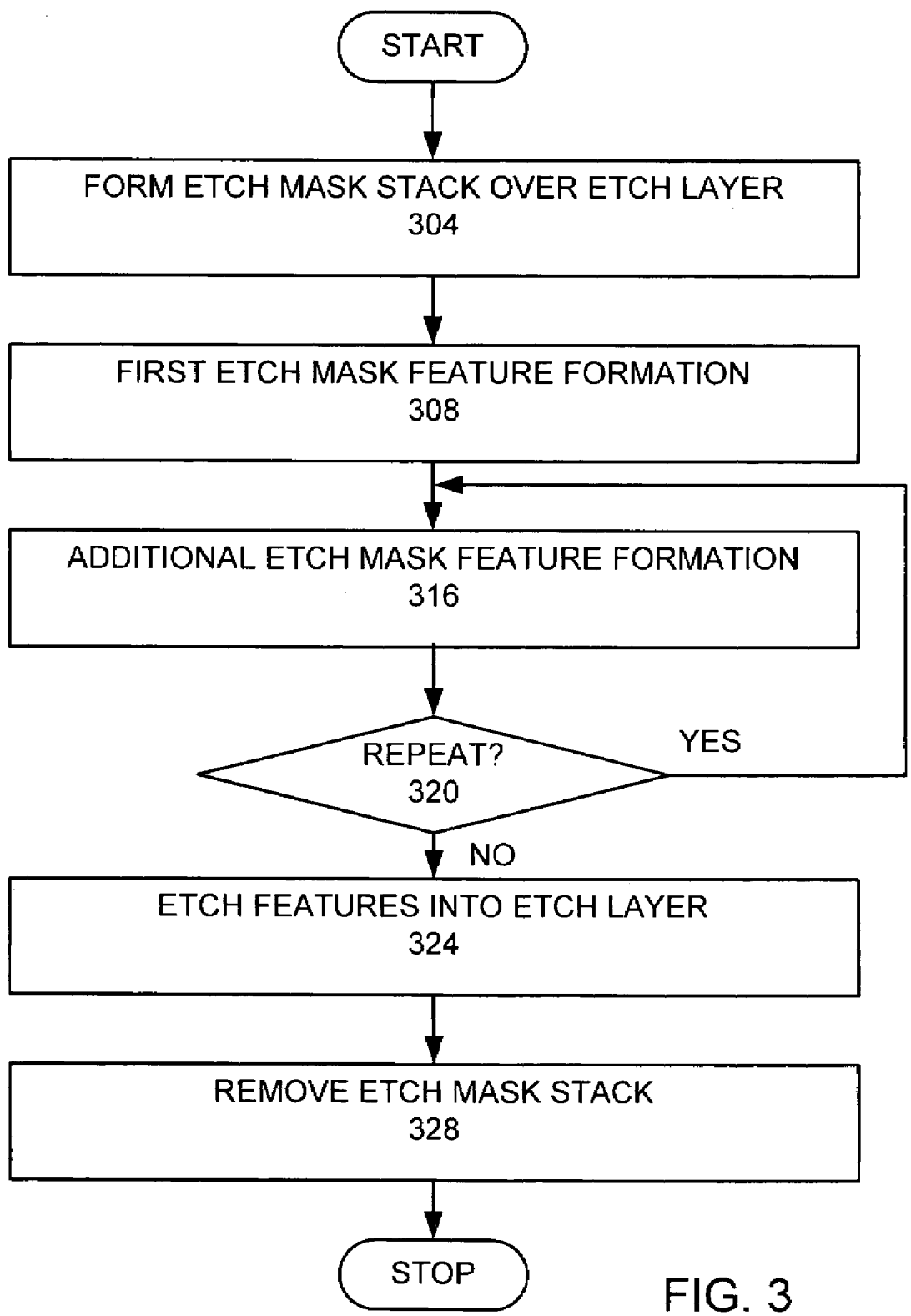
FIG. 3 is a high level flow chart of a process that may be used in an embodiment of the invention.
Figure 4:
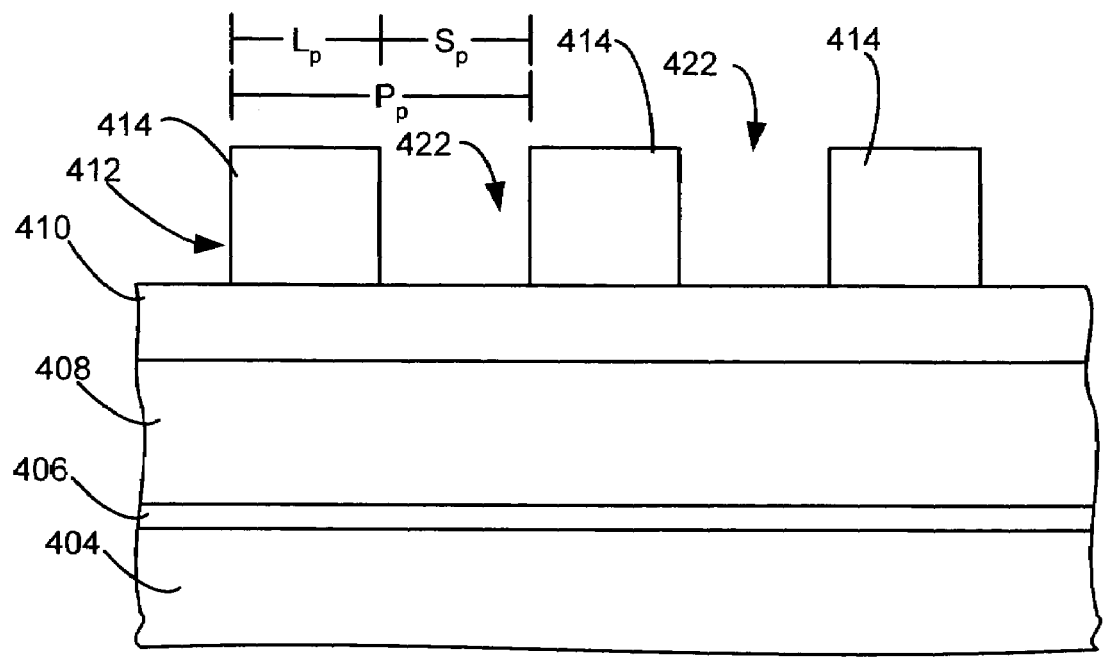
FIGS. 4A-J are schematic cross-sectional views of an etch layer processed according to an embodiment of the invention.
Figure 4:
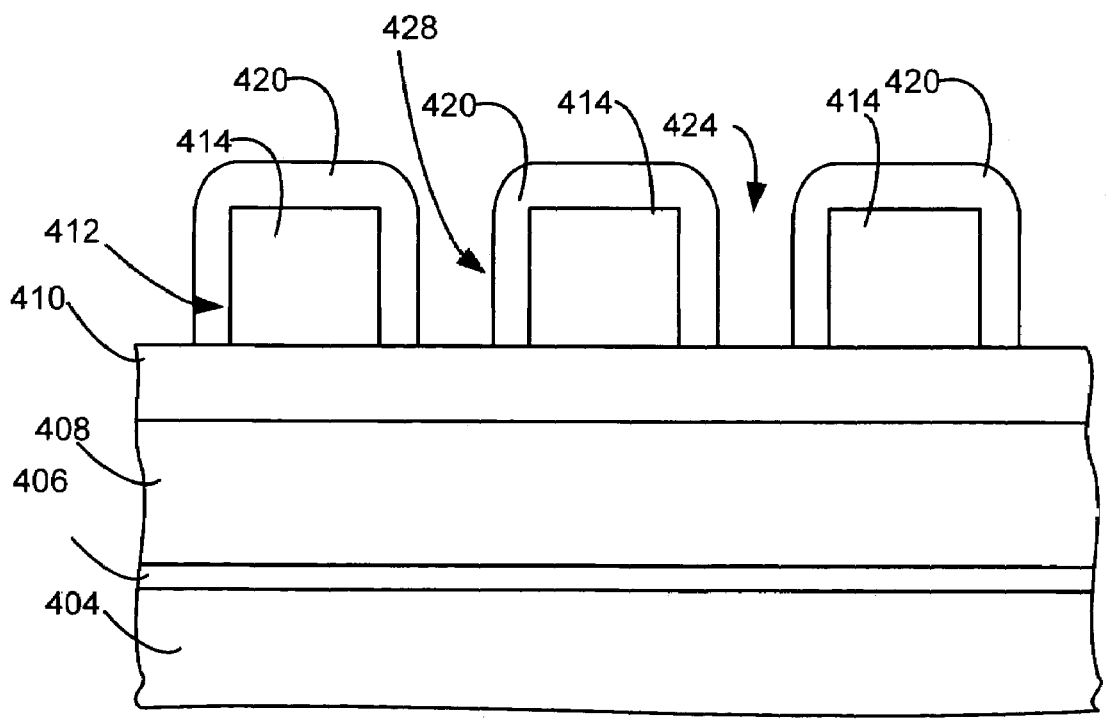
Figure 4:
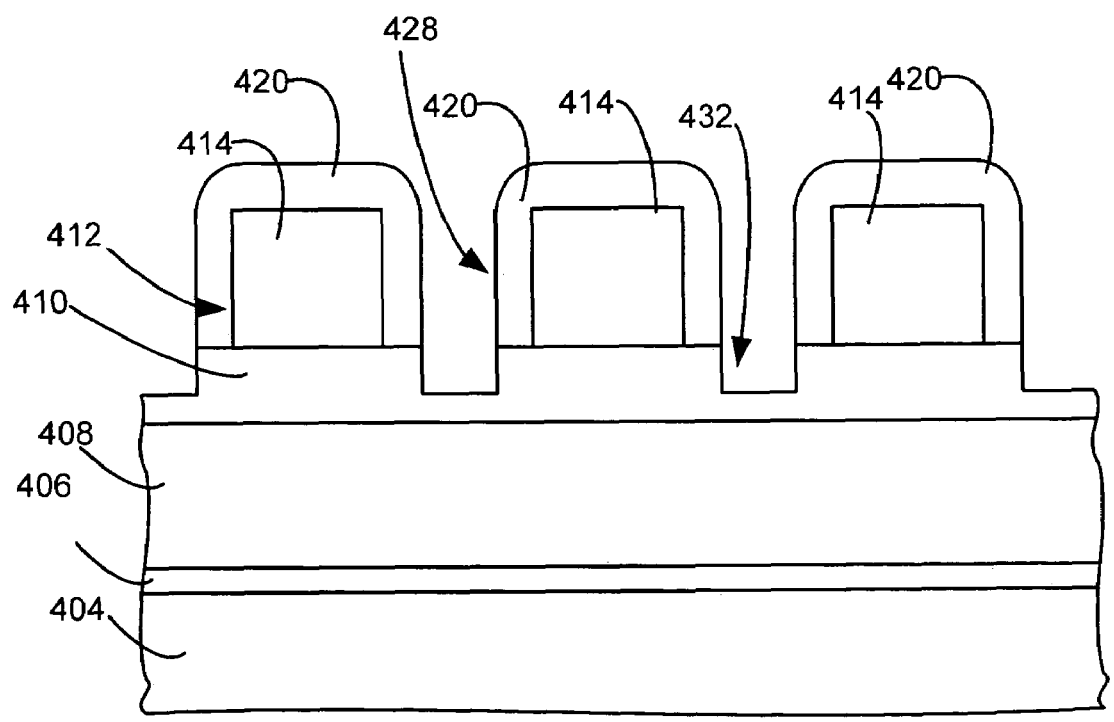
Figure 4:
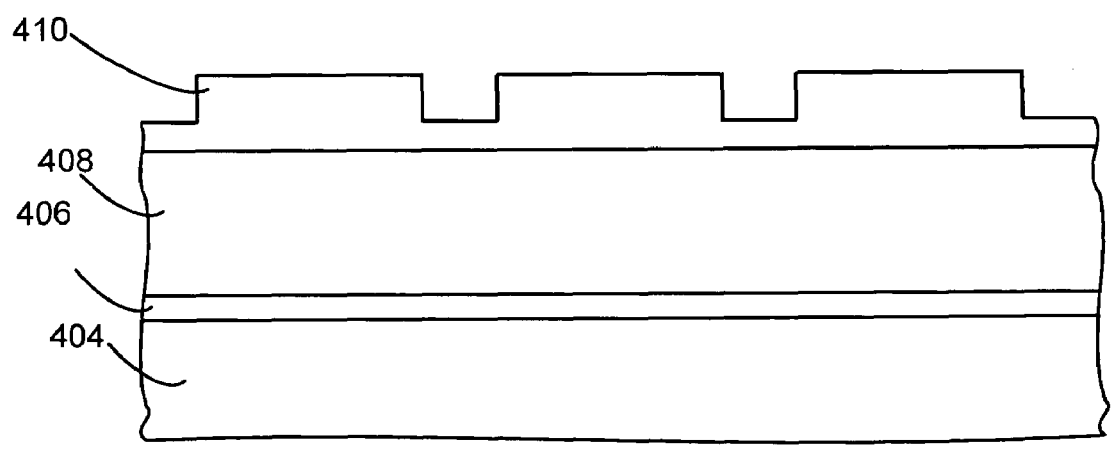
Figure 4:
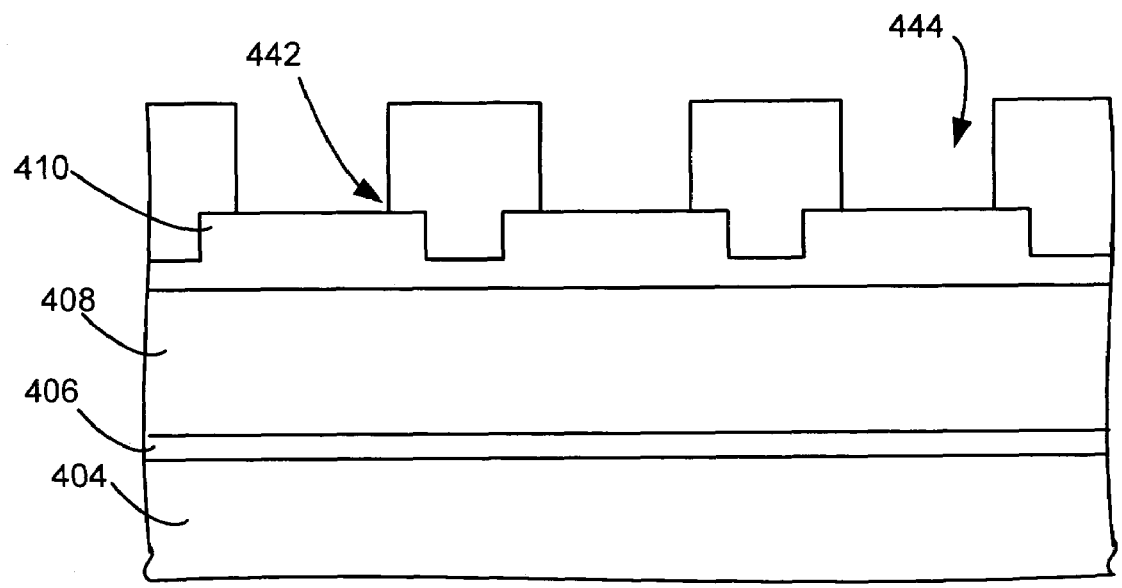
Figure 4:
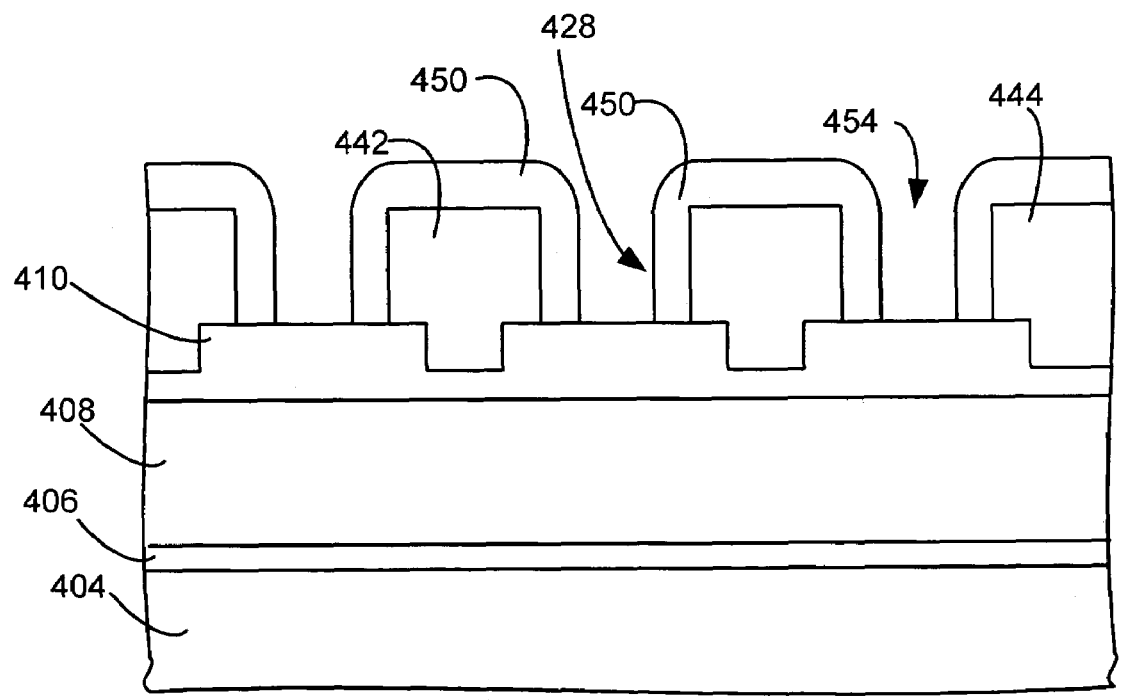
Figure 4:
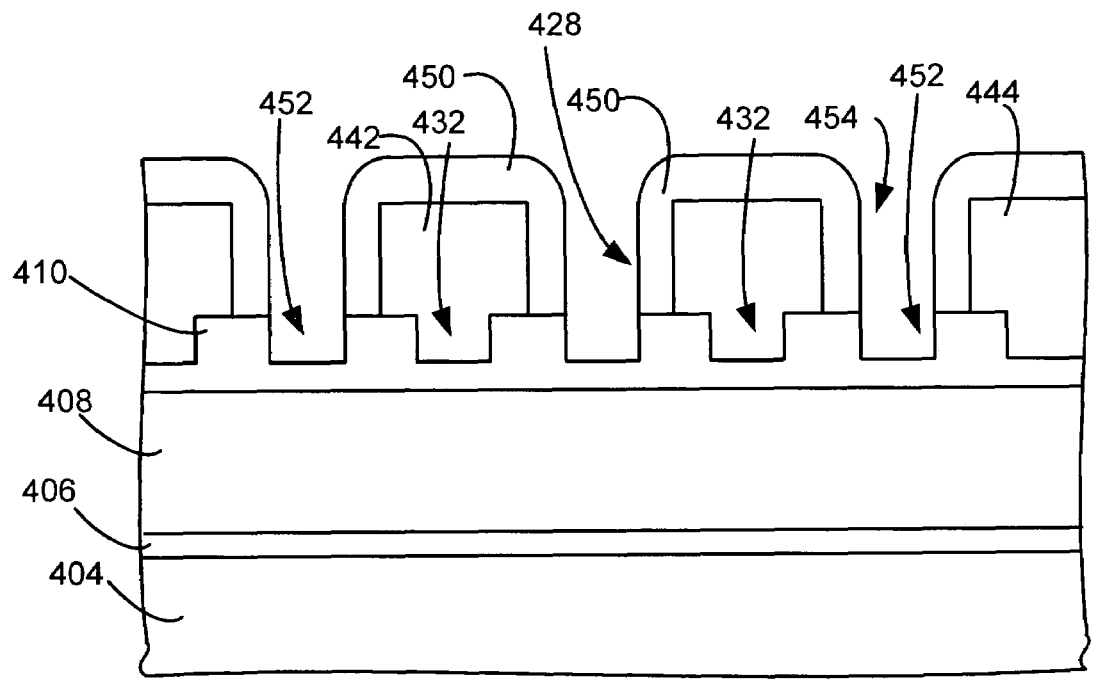
Figure 4:
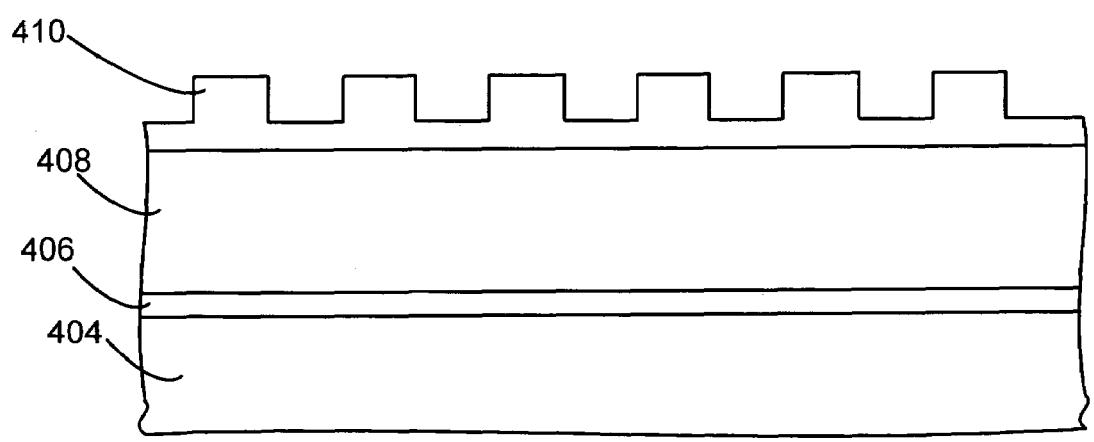

To facilitate understanding of the next generation mask process, FIG. 3 is a high level flow chart of a process that may be used in an embodiment of the invention. An etch mask stack is formed over an etch layer (step 304). FIG. 4A is a cross-sectional view of a substrate 404, such as a wafer, over which a barrier layer 406 is placed. Over the barrier layer 406 an etch layer 408 such as a conductive metal layer or a polysilicon layer or a dielectric layer is formed. Over the etch layer 408 the etch mask stack 410 is formed. The etch mask stack 410 may be one or more layers.

Figure 5:
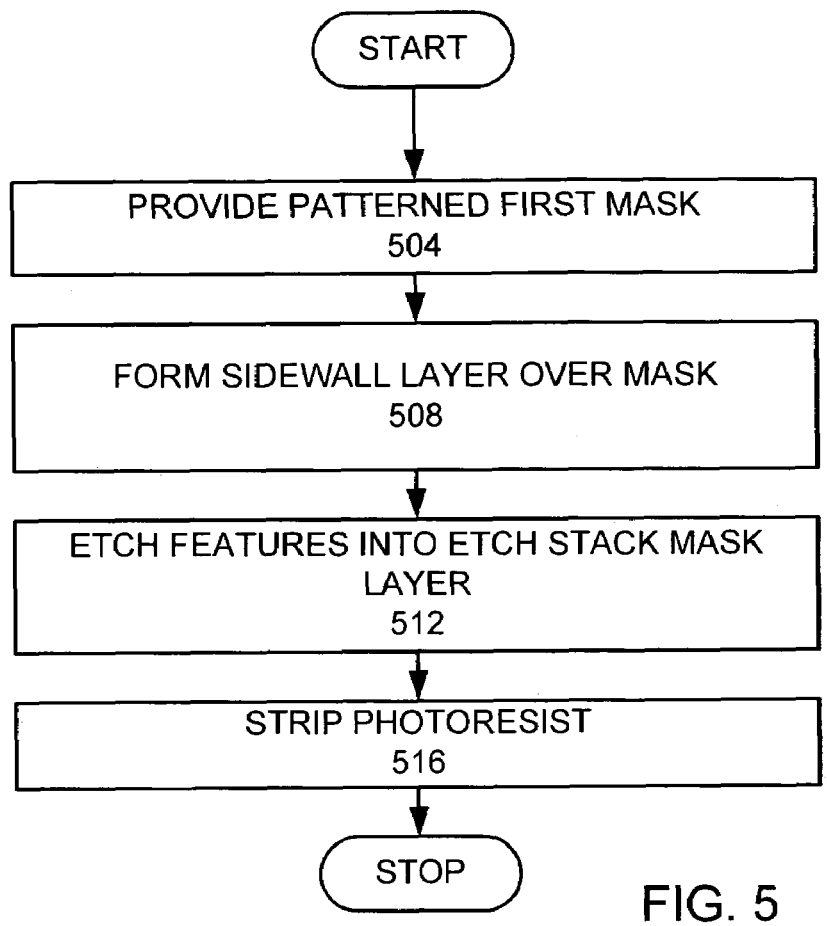
FIG. 5 is a more detailed flow chart of a step of forming the first features into the etch mask step.
Figure 6:
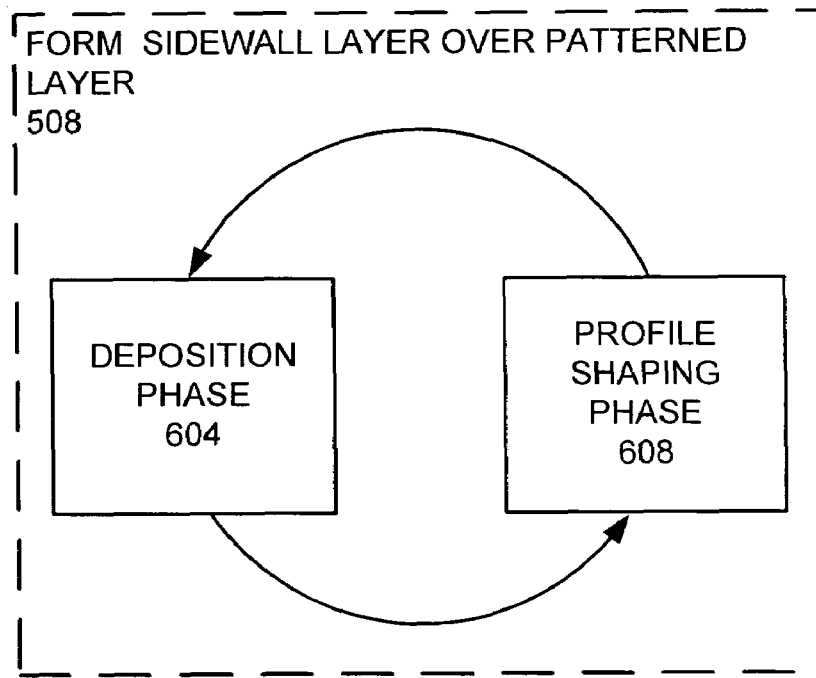
FIG. 6 is a flow chart of forming a sidewall layer over a patterned photoresist layer.

First features are then formed into the etch mask stack (step 308). FIG. 5 is a more detailed flow chart of the step of forming the first features into the etch mask step. A first patterned photoresist layer 412 is formed over the etch mask stack 410 (step 504). In this example, the patterned lines 414 have the width defined as the line width "$L_p$", as shown. The spaces 422 in the photoresist layer have a width "$S_p$", as shown. The pitch length "$P_p$" of the patterned photoresist layer is defined as the sum of the line width and the space width $P_p = L_p + S_p$, as shown. These widths are determined by the resolution of the lithographic techniques used to form the patterned photoresist layer. It is desirable to reduce the pitch length. A sidewall layer is formed over the patterned photoresist layer to reduce the CD (step 508). FIG. 6 is a more detailed flow chart of the forming a sidewall layer over the patterned photoresist layer to reduce CD (step 508), which uses gas modulation. In this embodiment, the forming the sidewall layer over the patterned photoresist layer to reduce CD (step 508) comprises a deposition phase 604 and a profile shaping phase 608. The deposition phase uses a first gas chemistry to form a plasma, which deposits a sidewall layer over the sidewalls of the patterned photoresist layer. The profile shaping phase 608 uses a second gas chemistry different from the first gas chemistry to form a plasma, which shapes the profile of the deposition to form substantially vertical sidewalls.

FIG. 4B is a schematic cross-sectional view of the patterned first patterned photoresist layer 412 with a sidewall layer 420 deposited over the sidewalls of the first patterned photoresist layer. The sidewall layer 420 forms a sidewall layer feature 424 within the patterned photoresist layer spaces, where the sidewall layer feature 424 has a reduced space CD that is less than the space CD of the first patterned photoresist layer. Preferably, the reduced space CD of the deposited first patterned photoresist layer is at least 50% less than the space CD of the first patterned photoresist layer feature. It is also desirable that the sidewall layer has substantially vertical sidewalls 428, which are highly conformal as shown. An example of a substantially vertical sidewall is a sidewall that from bottom to top makes an angle of between 88° to 90° with the bottom of the feature. Conformal sidewalls have a deposition layer that has substantially the same thickness from the top to the bottom of the feature. Non-conformal sidewalls may form a faceting or a bread-loafing formation, which provide non-substantially vertical sidewalls. Tapered sidewalls (from the faceting formation) or bread-loafing sidewalls may increase the deposited layer CD and provide a poor etching patterned photoresist layer. Preferably, the deposition on the side wall is thicker than the deposition on the bottom of the first patterned photoresist layer feature. More preferably, no layer is deposited over the bottom of the first patterned photoresist layer feature.

A first set of features are then etched into the etch stack mask 410 through the sidewall layer spaces (step 512). FIG. 4C shows a first set of features 432 etched into the etch stack mask 410. In this example, the first set of features 432 etched in the etch mask stack 410 has a CD width, which is equal to the space CD of the deposited layer feature. In practice, the CD of the features of the first set of features 432 may be slightly larger than the CD of the feature of the deposited layer 420. However, since the CD of the deposited layer feature is significantly smaller than the CD of the photoresist 412, the CD of the features in the etch mask stack 410 is still smaller than the CD of the photoresist 412. If the CD of the deposited layer was only slightly smaller than the CD of the photoresist, or if the deposited layer was faceted or bread loafed, then the CD of the etch mask stack not be smaller than the CD of the photoresist. In addition, a faceted or bread-loafing deposited layer may cause a faceted or irregularly shaped feature in the layer to be etched. It is also desirable to minimize deposition on the bottom of the photoresist feature. In this example, the CD of the features etched in the layer to be etched 408 is at least 50% less than the CD of the photoresist feature. In addition, in this example, the features 432 are etched partially through the etch mask stack 410. In other embodiments the features 432 may be etched completely through the etch mask stack 410.

The patterned photoresist layer and deposited layer are then stripped (step 516). This may be done as a single step or two separate steps with a separate deposited layer removal step and photoresist strip step. Ashing may be used for the stripping process. FIG. 4D shows the substrate 400 after the deposited layer and photoresist layer have been removed.

Figure 7:
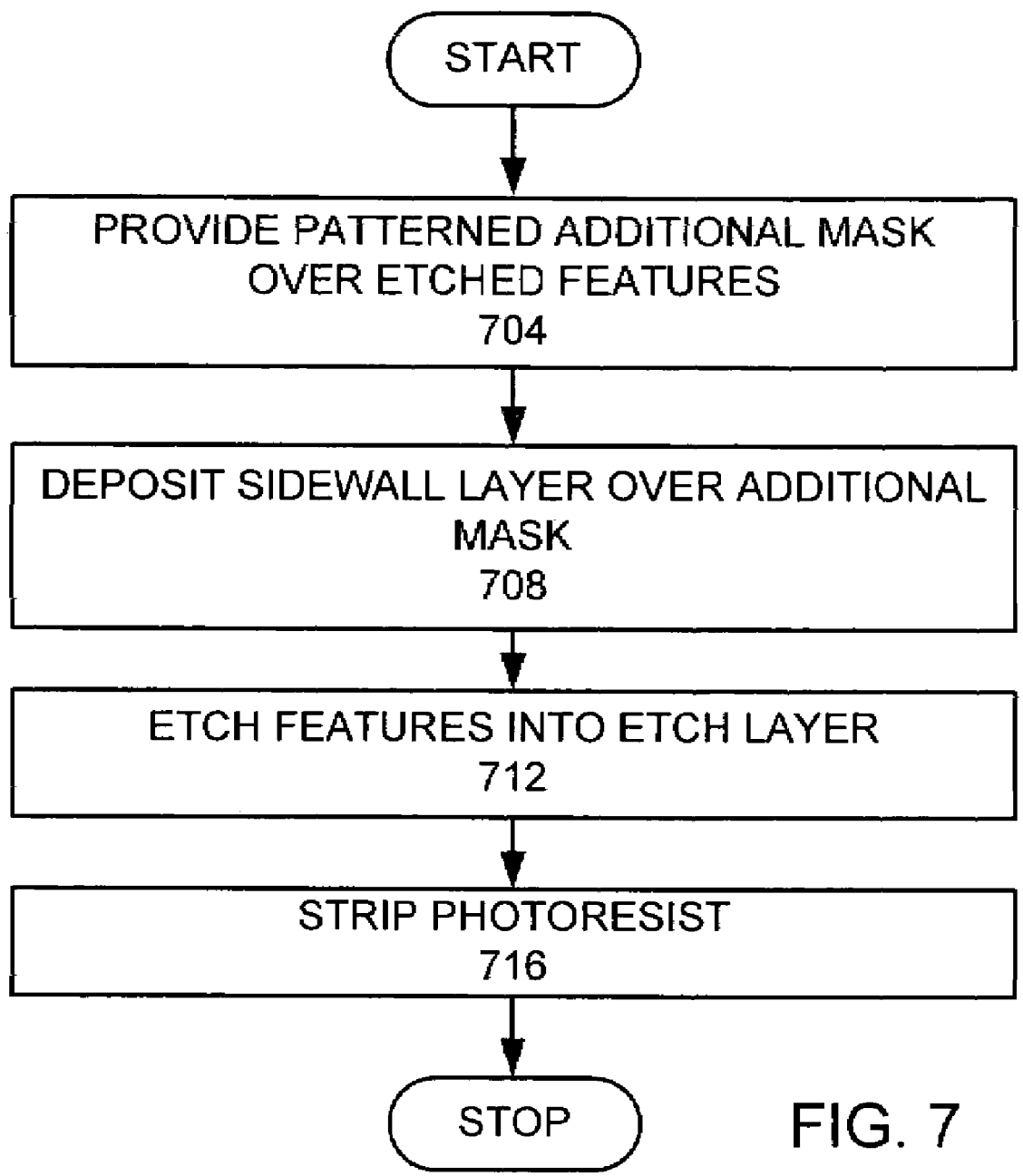
FIG. 7 is a more detailed flow chart of a step of forming the additional features into the etch mask step.

An additional etch mask stack feature is formed (step 316). FIG. 7 is a more detailed flow chart of the step of forming the additional features into the etch mask step. A patterned additional photoresist layer 442 is formed over the etch mask stack 410 (step 704). The patterned additional photoresist layer 442 would have the same pitch and CD as the first patterned photoresist layer. A sidewall layer is formed over the additional patterned photoresist layer to reduce the CD (step 708). The sidewall layer may be formed using the same process as forming the sidewall layer over the first patterned photoresist layer. FIG. 4F is a schematic cross-sectional view of the additional patterned photoresist layer 442 with a sidewall layer 450 deposited over the sidewalls of the additional patterned photoresist layer 442. The sidewall layer 450 forms a sidewall layer feature 454 within the patterned photoresist layer space, where the sidewall layer feature 454 has a reduced space CD that is less than the space CD of the additional patterned photoresist layer. Preferably, the reduced space of the sidewall layer feature is at least 50% less than the space CD of the second patterned photoresist layer feature. It is also desirable that the sidewall layer 450 has substantially vertical sidewalls, which are highly conformal as shown. An example of a substantially vertical sidewall is a sidewall that from bottom to top makes an angle of between 88° to 90° with the bottom of the feature. Preferably, the deposition on the side wall is thicker than the deposition on the bottom of the photoresist feature. More preferably, no layer is deposited over the bottom of the photoresist feature.

Features are etched into the etch mask stack (step 712) forming a second set of etch features 452 between the first set of etch features 432, as shown in FIG. 4G. The patterned photoresist layer and deposited layer are then stripped (step 716), as shown in FIG. 4H. The additional etch mask feature formation (step 316) is completed.

A check is made to see if any additional features are to be formed (step 320). In this example, only two sets of features are formed, so the process goes to the step of etching features into the etch layer (step 324). This is accomplished by using the etch mask stack 410 as an etch mask.

The etch mask stack 410 is then used as an etch mask to etch the etch layer 408, using the etch stack mask 410 as an etch mask (step 324), as shown in FIG. 4I. Preferably, this process uses a different etch chemistry than the etch chemistry used to etch features in the etch stack mask. In addition, preferably the etch chemistry selectively etches the etch layer 408 with respect to the etch stack mask 410.

The etch mask stack is then removed (step 328), as shown in FIG. 4J. In one embodiment, the etch mask stack is removed during the etching of the etch layer. In another embodiment, the etch mask stack is removed in a separate step after the etch layer has been completely etched. The line width of the etch layer is shown as $L_f$. The space width of the features in the etch layer is shown as $S_f$. The pitch length of the features is shown as $P_f$, where $P_f=L_f+S_f$. For comparison, patterned photoresist layer pitch $P_p$, photoresist line width $L_p$, and photoresist spacing $S_p$ from FIG. 4A, are shown in FIG. 4J for comparison with feature pitch $P_f$, feature line width $L_f$, and feature space width $S_f$. In this embodiment, the length of the pitch for the features $P_f$ is half the length of the pitch of the patterned photoresist layer $P_p$, since the line width between features $L_f$ is half of the line width of the patterned photoresist layer $L_p$ and the feature space width $S_f$ is half of the space in the patterned photoresist layer $S_p$. Therefore, this process is able to use two masking steps to double etch feature resolution, by reducing pitch length, line width, and feature width by half, while using the same photoresist lithography process. In this example the first set of etch features from the first patterned photoresist layer is etched to the same depth or about the same depth as the second set of etch features from the second patterned photoresist layer, as shown. By providing alternating features 462 etched from the first etch mask stack features and features 466 from the second etch mask stack features the reduces pitch is provided.

Single Layer Etch Mask Stack

In one embodiment of the invention, the etch mask stack is a single layer. In this embodiment, the single layer is a strip resistant layer. The strip resistant layer is preferably at least one of amorphous carbon and a strip resistant polymer. More preferably, the strip resistant layer is amorphous carbon. In the specification and claims, amorphous carbon is defined as a halogen free polymer. Strip resistant polymers or other materials used for the single layer of the etch mask stack should be sufficiently different than the photoresist so that the photoresist may be patterned and stripped using wet or dry process without removing the single layer. In one embodiment, the material forming the single layer is resistant to an oxygen stripping that is used to strip the photoresist. In another embodiment, the single layer is resistant to hydrogen containing gases or liquids used in the photoresist process. In another embodiment, the single layer is hardened, such as by using UV radiation so that the single layer is resistant to stripping processes. In the alternative, the single layer may be a material that is inherently resistant to the strip process used and does not need hardening. In such a case, the single layer material is resistant to hydrogen containing plasmas such as $H_2$ or $NH_3$ for a hydrogen strip process or is resistant to oxygen containing plasmas for an oxygen stripping process.

Multiple Layer Etch Mask Stack

Figure 8A:
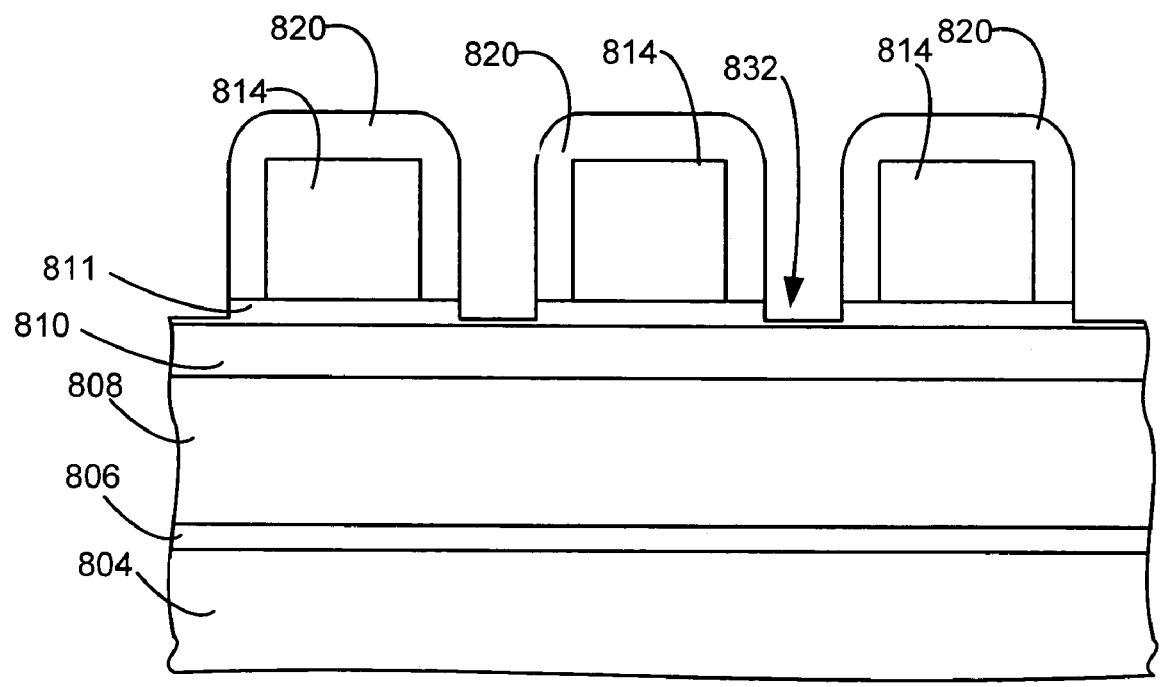
FIGS. 8A-F are schematic cross-sectional views of an etch layer processed according to another embodiment of the invention.

In another embodiment of the invention, the etch mask stack comprises two layers. FIG. 8A is a cross sectional view of an etch mask stack with a first layer 810 and a second layer 811 is placed over an etch layer 808, over a barrier layer 806 over a substrate 804. A photoresist mask 814 is placed over the second layer 811. A sidewall layer 820 is placed over the photoresist mask sidewalls to reduce CD. First mask features 832 are partially etched into the second layer 811 using a first etch chemistry, so that in this embodiment, the first mask features do not reach the first layer 810, as shown.

Figure 8B:
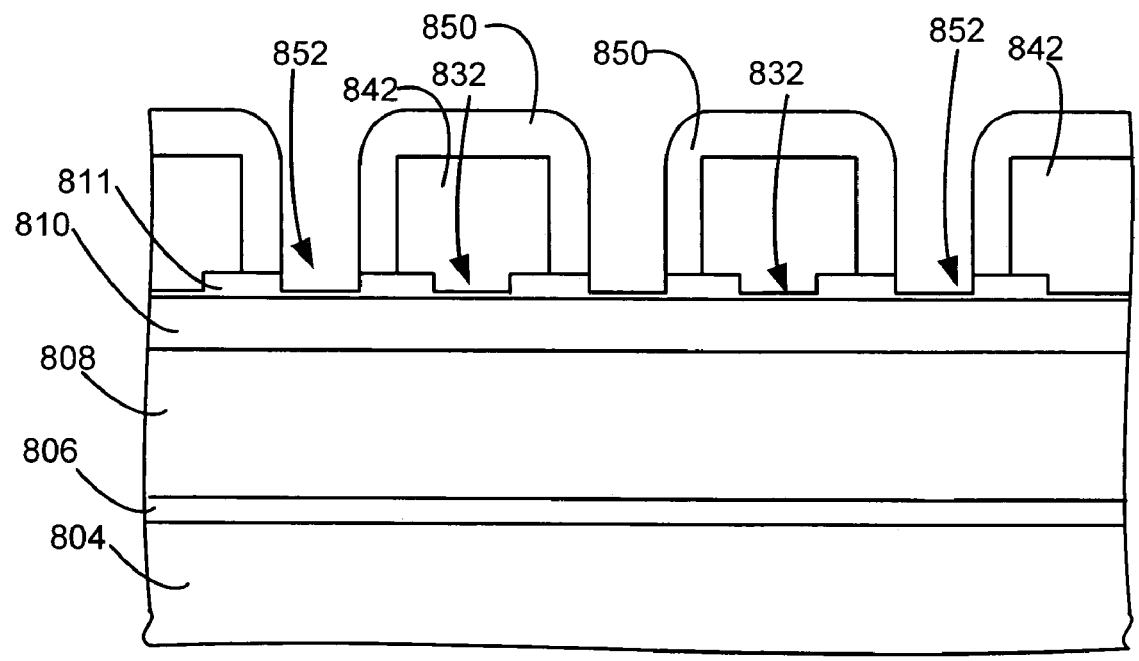

The photoresist mask 814 and sidewall layer 820 are removed and a second photoresist mask 842 is formed over the second layer 811, as shown in FIG. 8B. A sidewall layer 850 is formed over the second photoresist mask 842 to reduce CD. Second mask features 852 are partially etched into the second layer 811, so that in this embodiment, the second mask features do not reach the first layer 810, as shown. This etching may use the first etch chemistry, since the second layer 811 is being etched in both etches.

Figure 8C:
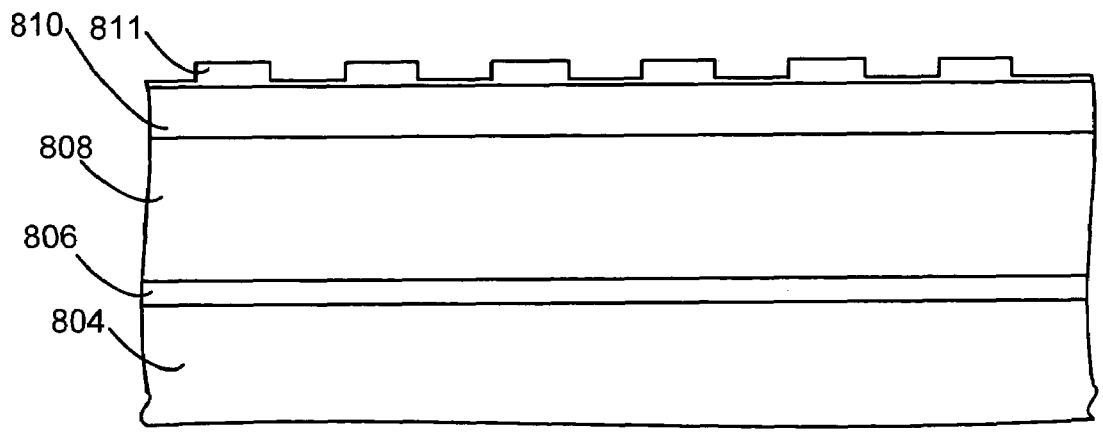
Figure 8D:
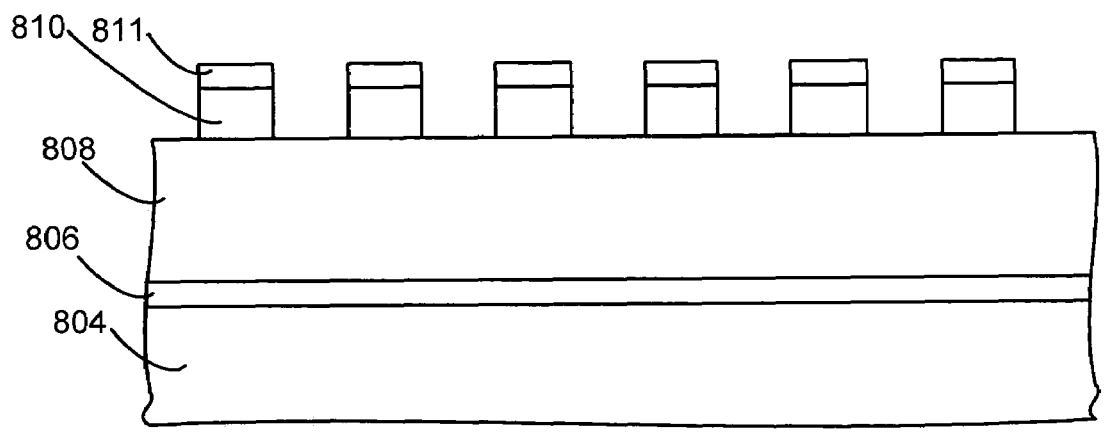

The photoresist mask and sidewall layer are removed from over the second layer 811, as shown in FIG. 8C. A second etch chemistry uses the second layer 811 as an etch mask for etching the first layer 810 of the etch mask stack, as shown in FIG. 8D. Since this etch selectively etches the first layer 810 with respect to the second layer 811, preferably, the second etch chemistry is different from the first etch chemistry. In one embodiment, the first layer 810 is etched only partially through. In another embodiment, the first layer 810 is etched completely through, as shown.

Figure 8E:
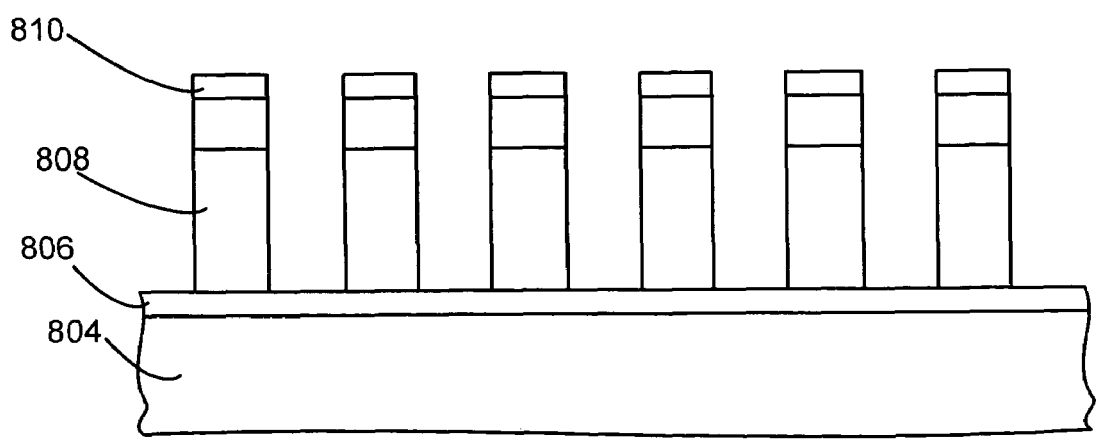
Figure 8F:
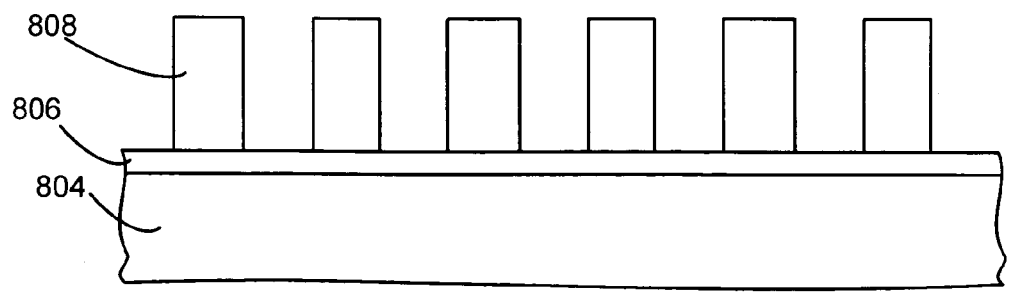

In one embodiment, the second layer is removed. In this embodiment, the second layer is not removed before a third etch chemistry is used to etch the features into the etch layer 808, as shown in FIG. 8E. Preferably, the third etch chemistry is different from the second etch chemistry, since the etch layer 808 is selectively etched with respect to the first layer 810 of the etch mask stack. The remaining etch mask stack formed from the first layer 810 and the second layer 811 are subsequently removed, as shown in FIG. 8F. In another embodiment, the second layer 811 of the etch mask stack is removed during the etching of the etch layer. In another embodiment, both the first layer 810 and the second layer 811 are removed during the etching of the etch layer 808.

In this embodiment, the second layer 811 acts as a strip protective mask, which acts as a protective mask during the photoresist strip of the first layer which acts as a next generation patterning mask. The strip protective mask 811 protects the next generation patterning mask 810 from damage during the stripping of the photoresist masks.

Figure 9A:
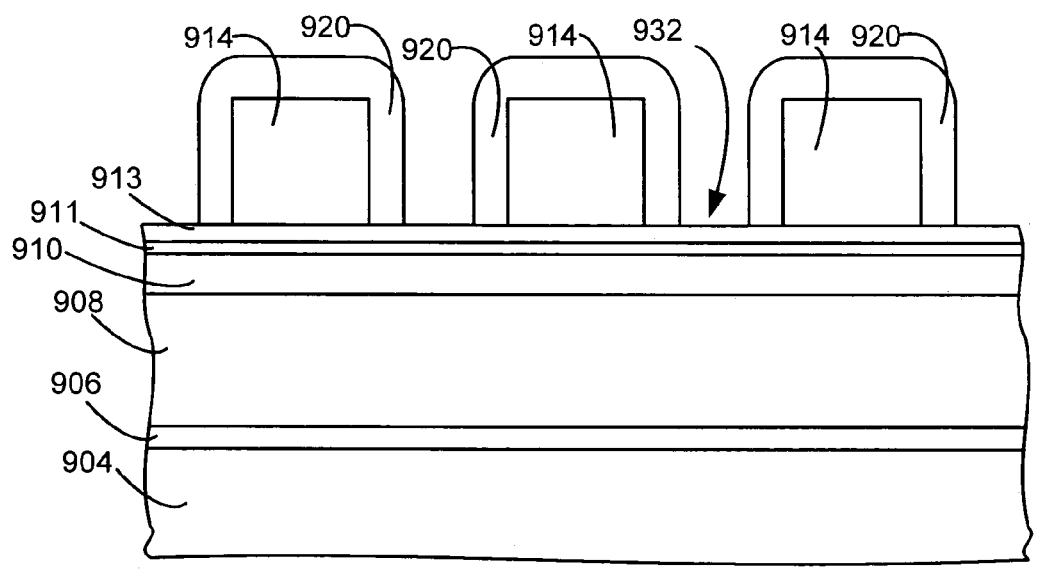
FIGS. 9A-F are schematic cross-sectional views of an etch layer processed according to another embodiment of the invention.
Figure 9B:
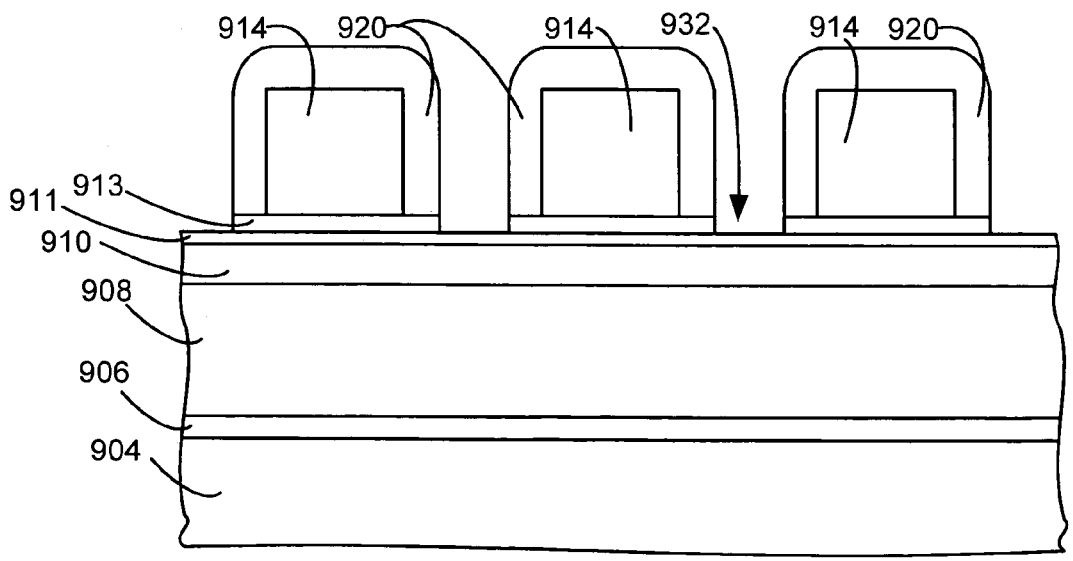

Although a single layer strip protective-mask may provide the desired goal, in some embodiments, control of the etch uniformity can be an issue. Unless uniformity of the strip protective mask is good, it is possible that some features may breach through and expose the first layer of the etch mask stack to the strip process, which can damage the first layer. To avoid this problem, a double layer strip protective mask may be used. FIG. 9A is a cross-sectional view of a substrate 904 below a barrier layer 906, below an etch layer 908, below an etch stack mask comprising a first layer 910, a second layer 911, and a third layer 913. A photoresist mask 914 has been formed above the third layer 913. A sidewall layer 920 is formed on the sidewalls of the photoresist mask 914. An etch process using a first etch chemistry is used to etch through the third layer 913 to the second layer 911. The second layer 911 is used as an etch stop layer, as shown in FIG. 9B. Therefore the first etch chemistry selectively etches the third layer with respect to the second layer. By providing an etch stop layer, the first layer 910 of the etch mask stack is protected from exposure during the stripping process. In this example, the third layer 913 acts as a strip protective mask.

Figure 9C:
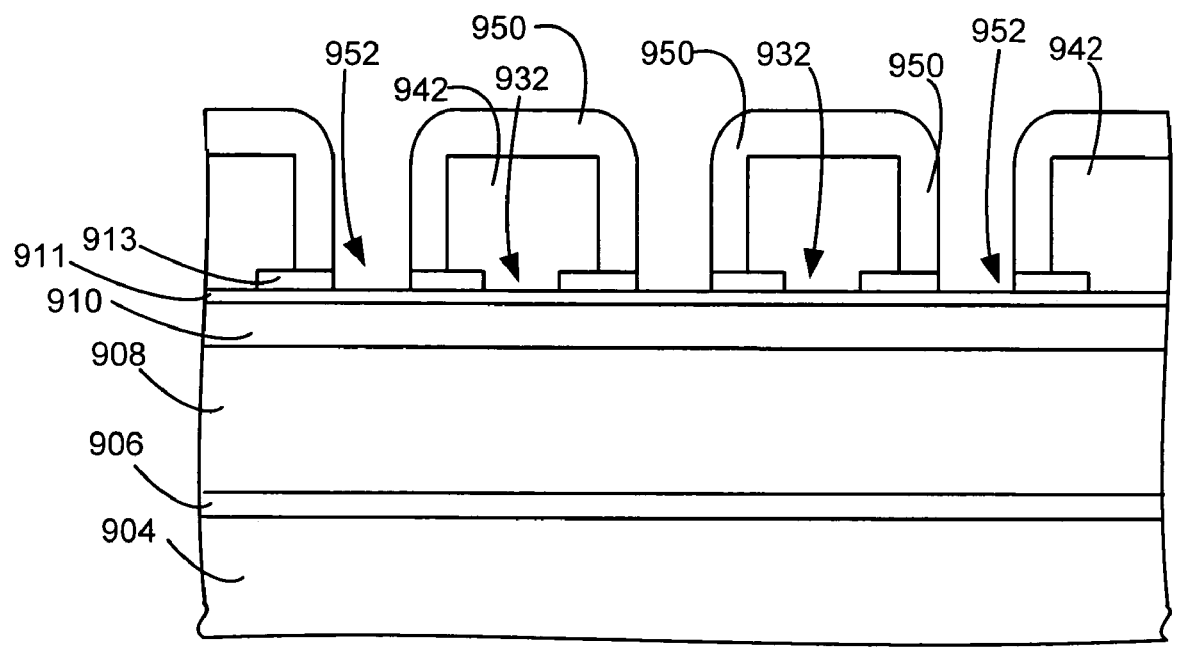

The photoresist mask 914 and sidewall layer 920 are removed and a second photoresist mask 942 is formed over the third layer 913. A sidewall layer 950 is formed over the second photoresist mask 942, as shown in FIG. 9C. The exposed portions of the third layer 913 are etched to the etch stop layer 911, using the first etch chemistry to form a second set of features 952.

Figure 9D:
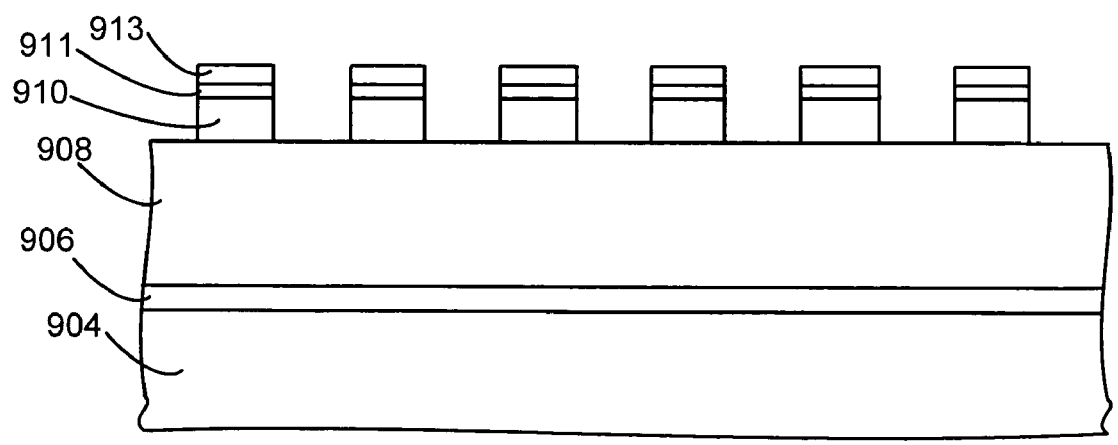

The photoresist mask 942 and the sidewall layer 950 are removed. A second etch chemistry different from the first etch chemistry is used to selectively etch the second layer 911 with respect to the third layer 913, as shown in FIG. 9D. A third etch chemistry is used to etch the first layer 910 of the etch mask stack. In one embodiment of the invention, the third etch chemistry is the same as the second etch chemistry. In another embodiment of the invention, the third etch chemistry is different than the second etch chemistry.

Figure 9E:
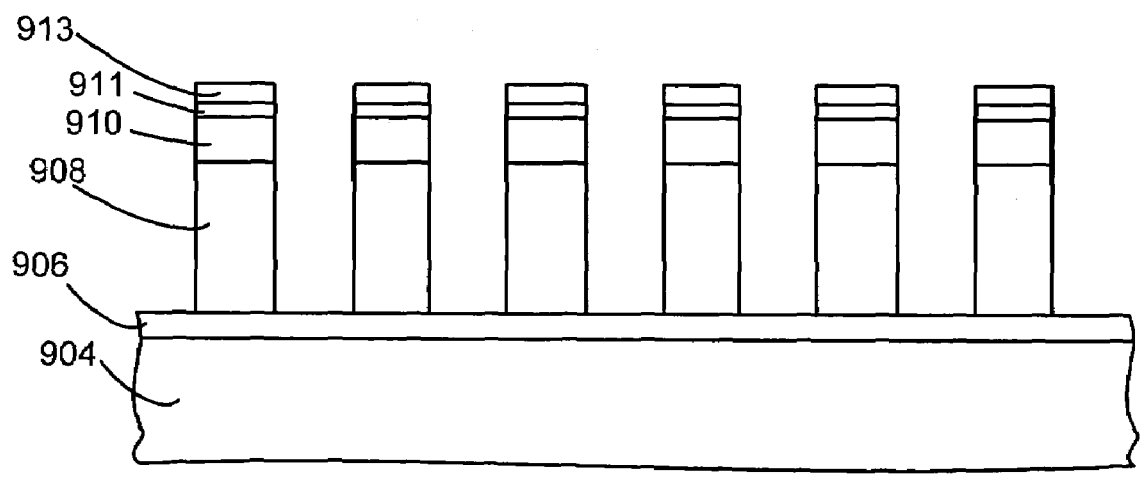
Figure 9F:
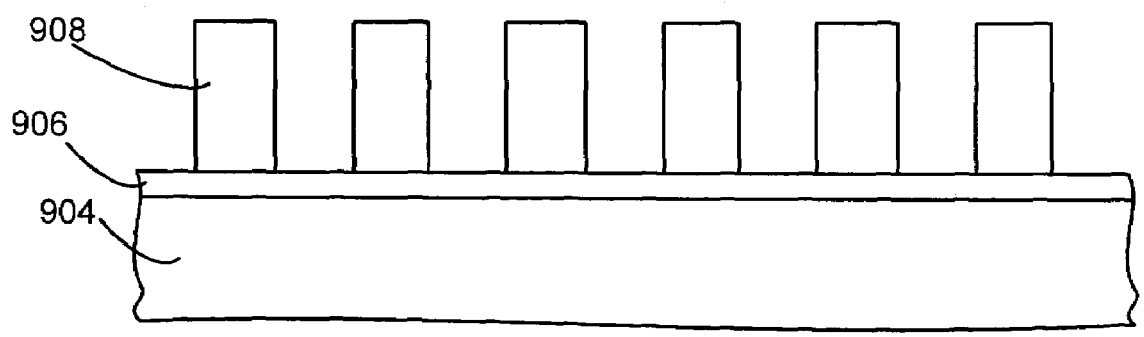

A fourth etch chemistry is used to etch features into the etch layer 908 through the first layer 910 of the etch mask stack, as shown in FIG. 9E. In the preferred embodiment the fourth etch chemistry is different than the third etch chemistry to allow the etch layer 908 to be selectively etched with respect to the first layer 910. The etch mask stack is then stripped, as shown in FIG. 9F. In one embodiment the third layer 913 and possibly the second layer 911 of the etch mask stack are removed before the etch layer 908 is etched.

In this triple layer etch mask stack, many combinations of material can be used. In one embodiment, the strip protective mask 913 is $SiO_2$ and the etch stop mask 911 is at least one of SiC, $Si_2N_3$, SiOC, SiON, Ta, TaN, Ti, TiN or any other material that can be etch selectively with respect to $SiO_2$. In another embodiment, the strip protective mask 913 is SiC and the etch stop mask 911 is at least one of $SiO_2$, $Si_2N_3$, SiOC, SiON, Ta, TaN, Ti, and TiN. In another embodiment the strip protective mask 913 is $Si_2N_3$ and the etch stop mask 911 is at least one of $SiO_2$, SiC, SiOC, SiON, Ta, TaN, Ti, and TiN. In another embodiment the strip protective mask 913 is SiON and the etch stop mask 911 is at least one of $SiO_2$, SiC, SiOC, $Si_2N_3$, Ta, TaN, Ti, and TiN. In another embodiment the strip protective mask 913 is SiOC and the etch stop mask 911 is at least one of $SiO_2$, SiC, SiON, $Si_2N_3$, Ta, TaN, Ti, and TiN. In another embodiment the strip protective mask 913 is at least one of TiN, Ta, TaN, and Ti and the etch stop mask 911 is at least one of $SiO_2$, SiC, SiON, and $Si_2N_3$. Most preferably, the strip protective mask is $SiO_2$, since $SiO_2$ is very resistant damage during a photoresist strip process.

Other embodiments of the inventions may use more than two sets of etch mask stack features. For example, three sets of etch mask stack features may be used so that the feature layout has a pitch that is one third of the pitch of each reticle. In another example, four sets of etch mask stack features may be used so that the feature layout has a pitch that is one fourth of the pitch of each reticle. Such multimask processes are described in U.S. patent application Ser. No. 11/050,985 filed Feb. 3, 2005, by Jeffrey Marks and Reza Sadjadi entitled "Reduction of Feature Critical Dimensions Using Multiple Masks," which is incorporated by reference for all purposes.

Without the etch mask stack, different photoresist materials or different tools cause process shifts. The etch mask stack reduces process shift for different photoresist materials and different tools. The multimask process causes a layer to be subjected to multiple photoresist depositions and multiple strippings. The etch mask stack reduces damage to the etch layer that may be caused by multiple photoresist depositions and multiple strippings.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming etch features in an etch layer over a substrate, comprising:
    forming an etch mask stack formed by at least one layer over the etch layer;
    forming a first mask over the etch mask stack wherein the first mask defines a plurality of spaces with widths and a first pitch;
    forming a sidewall layer over the first mask wherein the sidewall layer reduces the widths of the spaces defined by the first mask, wherein the forming a sidewall layer over the first mask comprises at least two cycles, wherein each cycle comprises:
        a deposition phase with a first gas chemistry to form a deposition plasma to form a deposition over the sidewalls of the first mask; and
        a profile shaping phase with a second gas chemistry to shape the profile of the deposition over the sidewalls of the first mask, wherein the first gas chemistry is different than the second gas chemistry;
    etching a first set of features at least partially into the etch mask stack through the sidewall layer, wherein the features of the first set of features have widths that are smaller than the widths of the spaces defined by the first mask;
    removing the mask and sidewall layer;
    performing an additional feature step, comprising:
        forming an additional mask over the etch mask stack, wherein the additional mask defines a plurality of spaces with widths;
        forming a sidewall layer over the additional mask, wherein the sidewall layer reduces the widths of the spaces defined by the additional mask;
        etching a second set of features at least partially into the etch mask stack through the sidewall layer, wherein the features have widths that are smaller than the widths of the spaces defined by the additional mask, wherein the features further have a second pitch smaller than the first pitch; and
        removing the mask and sidewall layer; and
    etching a plurality of features into the etch layer through the first set of features and the second set of features in the etch mask stack.

2. The method, as recited in claim 1, wherein the etch mask stack comprises a strip resistant layer of a material that is more resistant to stripping than the first mask and the second mask.

3. The method, as recited in claim 2, wherein the strip resistant layer comprises at least one of an amorphous carbon, a hydrocarbon, a hydrofluorocarbon, and polymer material.

4. The method, as recited in claim 3, wherein the etch mask stack further comprises a strip protection layer over the strip resistant layer.

5. The method, as recited in claim 4, wherein the etch mask stack further comprises an etch stop layer between the strip protection layer and the strip resistant layer.

6. The method, as recited in claim 1, further comprising repeating the additional feature step at least once.

7. The method, as recited in claim 1, wherein
    forming a sidewall layer over the additional mask is at least one cycle, the cycle comprising:
        a deposition phase with a third gas chemistry to form a deposition plasma to form a deposition over the sidewalls of the additional mask; and
        a profile shaping phase with a fourth gas chemistry to shape the profile of the deposition over the sidewalls of the additional mask, wherein the third gas chemistry is different than the fourth gas chemistry.

8. The method, as recited in claim 7, wherein forming the sidewall layers over the additional mask is performed for at least two cycles.

9. The method, as recited in claim 8, wherein the forming the sidewall layer forms sidewalls having an angle from bottom to top of between 88 degrees and 90 degrees.

10. The method, as recited in claim 8, wherein the first mask and additional mask are photoresist masks, and wherein the sidewall layers are formed from a polymer material.

11. The method, as recited in claim 8, wherein the removing the mask and sidewall layer comprises ashing the mask and sidewall layer.

12. The method, as recited in claim 1, wherein the widths of the features of the first set of features are at least 50% less than widths of the spaces defined by the first mask.

13. The method, as recited in claim 1, wherein the spaces in the first mask have a pitch length and wherein the features formed in the etch layer have a pitch length that is at least 50% less than the pitch length of the spaces defined by the first mask.

14. The method, as recited in claim 1, wherein the etching the first set of features does not etch the etch layer.

15. The method, as recited in claim 1, further comprising removing the etch mask stack.

16. A semiconductor device formed by the method of claim 1.

17. A method for forming features in an etch layer, comprising:
    forming an etch mask stack formed by at least one layer over the etch layer;
    forming a first mask over the etch mask stack wherein the first mask defines a plurality of spaces with widths and wherein the plurality of spaces have a critical dimension and a pitch;
    forming a sidewall layer over the first mask wherein the sidewall layer reduces the widths of the spaces defined by the first mask, wherein the forming a sidewall layer over the first mask comprises at least two cycles, wherein each cycle comprises:

a deposition phase with a first gas chemistry to form a deposition plasma to form a deposition over the sidewalls of the first mask; and a profile shaping phase with a second gas chemistry to shape the profile of the deposition over the sidewalls of the first mask, wherein the first gas chemistry is different than the second gas chemistry;

etching a first set of features partially into the etch mask stack through the sidewall layer with a first etch chemistry, wherein the features have widths and a critical dimension, wherein the feature widths are at least 50% less than the widths of the spaces in the first mask and the critical dimension of the features is at least 50% less than the critical dimension of the spaces in the first mask and wherein the etch layer is not etched;

removing the mask and sidewall layer;

performing an additional feature step, comprising:

forming an additional mask over the etch mask stack wherein the additional mask defines a plurality of spaces with widths and wherein the plurality of spaces have a critical dimension and a pitch;

forming a sidewall layer over the additional mask, wherein the sidewall layer reduces the widths of the spaces defined by the additional mask;

etching additional features partially into the etch stack mask through the sidewall layer, wherein the additional features have widths and a critical dimension, wherein the widths of the additional features are at least 50% less than the widths of the spaces in the additional mask and the critical dimension of the additional features is at least 50% less than the critical dimension of the spaces in the additional mask and wherein the features and additional features have a pitch which is at least 50% less than the pitch of the spaces in the first mask and the pitch of the spaces in the additional mask and wherein the etch layer is not etched; and removing the mask and sidewall layer; and etching a plurality of features into the etch layer through the first set of features and additional features of the etch mask stack using a second etch chemistry different from the first etch chemistry.

18. The method, as recited in claim 17, wherein the forming a sidewall layer over the additional mask comprises at least two cycles, wherein each cycle comprises:

a deposition phase with a third gas chemistry to form a deposition plasma to form a deposition over the sidewalls of the additional mask; and a profile shaping phase with a fourth gas chemistry to shape the profile of the deposition over the sidewalls of the additional mask, wherein the third gas chemistry is different than the fourth gas chemistry.

19. The method, as recited in claim 17, wherein the first mask is a photoresist mask and wherein the sidewall layer is of a polymer material.

20. The method, as recited in claim 19, wherein the etch mask stack comprises a strip resistant layer of a material that is more resistant to stripping than the first mask and the second mask and further comprising removing the etch stack mask.

21. The method of claim 1, wherein the additional mask fills in said first set of features.

* * * * *